United States Patent
Callahan et al.

(10) Patent No.: US 7,289,335 B2
(45) Date of Patent: Oct. 30, 2007

(54) FORCE DISTRIBUTING SPRING ELEMENT

(75) Inventors: Daniel Lyle Callahan, Nashua, NH (US); Raymond Joseph Iannuzzelli, Amherst, NH (US); S. Daniel Cromwell, Penryn, CA (US); James D. Hensley, Rocklin, CA (US); Zoila Vega-Marchena, Austin, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 476 days.

(21) Appl. No.: 10/615,011

(22) Filed: Jul. 8, 2003

(65) Prior Publication Data
US 2005/0007748 A1 Jan. 13, 2005

(51) Int. Cl.
*G11C 11/00* (2006.01)
(52) U.S. Cl. .................................. 361/803
(58) Field of Classification Search .......... 361/803, 361/810, 825, 802, 683, 685, 732, 740, 704, 361/785; 439/65–69, 330, 76.2; 165/185; 174/260–266; 257/718–720
See application file for complete search history.

(56) References Cited

U.S. PATENT DOCUMENTS

| | | | | |
|---|---|---|---|---|
| 4,611,869 A | * | 9/1986 | Bonnefoy | 439/373 |
| 5,287,757 A | * | 2/1994 | Polaert et al. | 73/862.627 |
| 5,738,531 A | * | 4/1998 | Beaman et al. | 439/71 |
| 5,770,891 A | * | 6/1998 | Frankeny et al. | 257/727 |
| 6,224,396 B1 | | 5/2001 | Chan et al. | |
| 6,249,440 B1 | | 6/2001 | Affolter | |
| 6,282,093 B1 | | 8/2001 | Goodwin | |
| 6,375,475 B1 | | 4/2002 | Brodsky | |
| 6,386,890 B1 | | 5/2002 | Bhatt et al. | |
| 6,430,050 B1 | | 8/2002 | Hensley et al. | |
| 6,475,011 B1 | | 11/2002 | Sinha et al. | |
| 6,477,058 B1 | | 11/2002 | Luebs et al. | |
| 6,549,418 B1 | | 4/2003 | Deeney | |
| 6,657,131 B2 | * | 12/2003 | Gonzalez et al. | 174/260 |
| 6,885,557 B2 | * | 4/2005 | Unrein | 361/704 |
| 2002/0127894 A1 | | 9/2002 | Brodsky | |
| 2003/0000080 A1 | | 1/2003 | Colbert et al. | |
| 2003/0032310 A1 | | 2/2003 | Weiss et al. | |
| 2003/0036301 A1 | | 2/2003 | Colbert et al. | |

OTHER PUBLICATIONS

J.S. Corbin, "Land Grid Array Sockets for Server Applications" IBM J. Res. & Dev. vol. 46 No. 6 Nov. 2002, pp. 763-778.

* cited by examiner

Primary Examiner—Tuan T. Dinh
(74) Attorney, Agent, or Firm—Dicke, Billig & Czaja, P.L.L.C.

(57) ABSTRACT

A force distributor is configured for disposition between a printed circuit board and a stiffening plate, which is spaced from the printed circuit board. The force distributor is configured to distribute a compressive force between the printed circuit board, an interposer and a land grid array module carried on a side of the printed circuit board opposite the stiffening plate. The force distributor comprises a spring element comprising a first portion and a second portion with the first portion extending radially outward from the second portion. The spring element is configured for placement so that the first portion is secured to the stiffening plate and the second portion is biased in unsecured, pressing contact against the printed circuit board.

5 Claims, 4 Drawing Sheets

FORCE DISTRIBUTING SPRING ELEMENT

BACKGROUND

Ever since the advent of the first computer, there has been an unending drive to make computers and their components smaller, faster, and more powerful. These goals have created a whole new array of engineering concerns such as making a high number of robust electrical connections in very small spaces as well as providing for near-zero tolerance flatness of component casings. Other concerns include selecting materials to minimize differences in the coefficients of thermal expansion between the different types of conductive and non-conductive materials used in electronic components.

One type of computer-based electronic component is a land grid array (LGA) module which is an integrated circuit package that is connected to a printed circuit board via a land grid array (LGA) socket connector. A promising type of land grid array socket connector is an interposer which is disposed between the land grid array module and the printed circuit board. The interposer positions a contact array of the land grid array module in alignment with a contact array of the interposer, and positions a contact array of the printed circuit board in alignment with the contact array of the interposer. These aligned components are then compressed into a secured assembly of components to maintain electrical contact between respective elements of the contact arrays.

Various techniques have been employed to supply the compressive force on the component assembly, such as clamping with combinations of compressive screws, helical springs, and/or loading plates. A backing or stiffening plate is disposed on either side of the printed circuit board to lend additional support during application of the compressive force on the component assembly of the land grid array module, interposer, and printed circuit board. For example, see U.S. Pat. Nos. 6,549,418 and 6,198,630.

FIG. 1 illustrates a force pattern resulting from a conventional land grid array system that includes an array of conductive elements of a land grid array module in contact with an array of conductive elements of a printed circuit board via an interposer. As shown in FIG. 1, larger contact forces are observed near the corners and edges of the contact array with lesser contact forces observed near the center of the contact array. This force pattern is primarily the result of conventional securing mechanisms including helical springs mounted at the corners of these members which are used to create a compressive force between adjoining members. In addition, each contact element of in the array bears an individual load. While each contact element theoretically would bear the same force, in practice contact elements of the arrays near the center exhibit less force that contact elements of the arrays at the edges and corners. Moreover, even small variations in the flatness of various components, such as a land grid array module or a printed circuit board, as well as deflection of those components upon compression and electrical activation, contribute to variations in contact forces between adjacent contact elements of the arrays. Finally, not even the presence of a backing plate (or stiffening plate) can completely prevent or counteract deflections of the components (e.g. printed circuit board) that is caused by compressive loading.

Accordingly, despite constant refinement of compression techniques, the ongoing drive toward miniaturization and smaller tolerances places a continuing demand on improved compression techniques.

SUMMARY

One aspect of the present invention provides a force distributor configured for disposition between a printed circuit board and a stiffening plate, which is spaced from the printed circuit board. The force distributor is configured to distribute a compressive force between the printed circuit board, an interposer and a land grid array module carried on a side of the printed circuit board opposite the stiffening plate. The force distributor comprises a spring element defining a curved member including a first portion and a second portion with the first portion extending radially outward from the second portion. The spring element is configured for placement so that the first portion is secured to the stiffening plate and the second portion is biased in unsecured, pressing contact against the printed circuit board.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following Detailed Description, therefore, is not to be taken in a limiting sense, and the scope of the present invention is defined by the appended claims.

Figure 1:
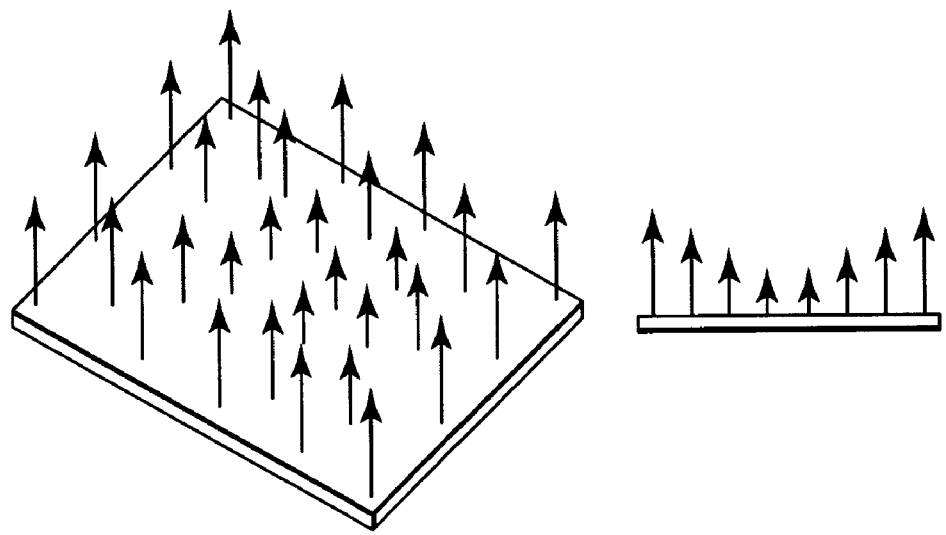
FIG. 1 is an illustration of a conventional force pattern.
Figure 2:
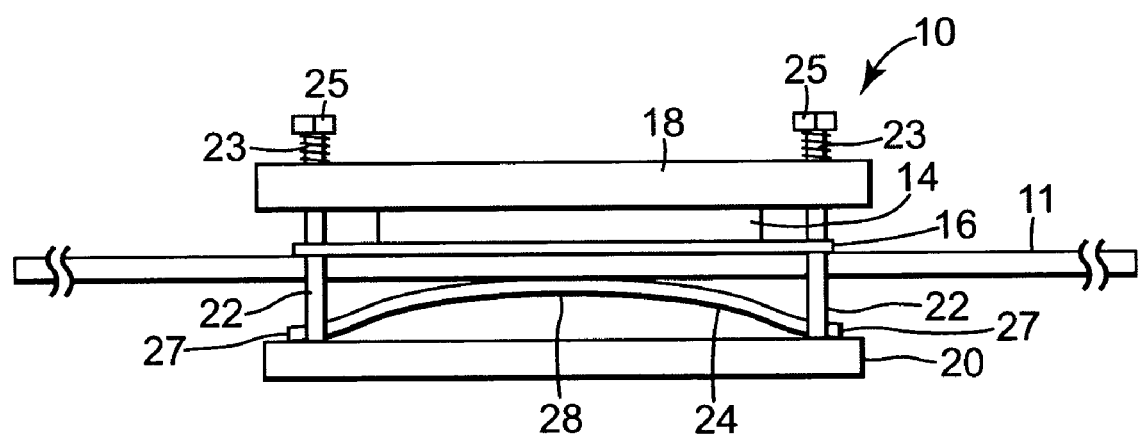
FIG. 2 is a side view of module system, according to an embodiment of the present invention.
Figure 3:
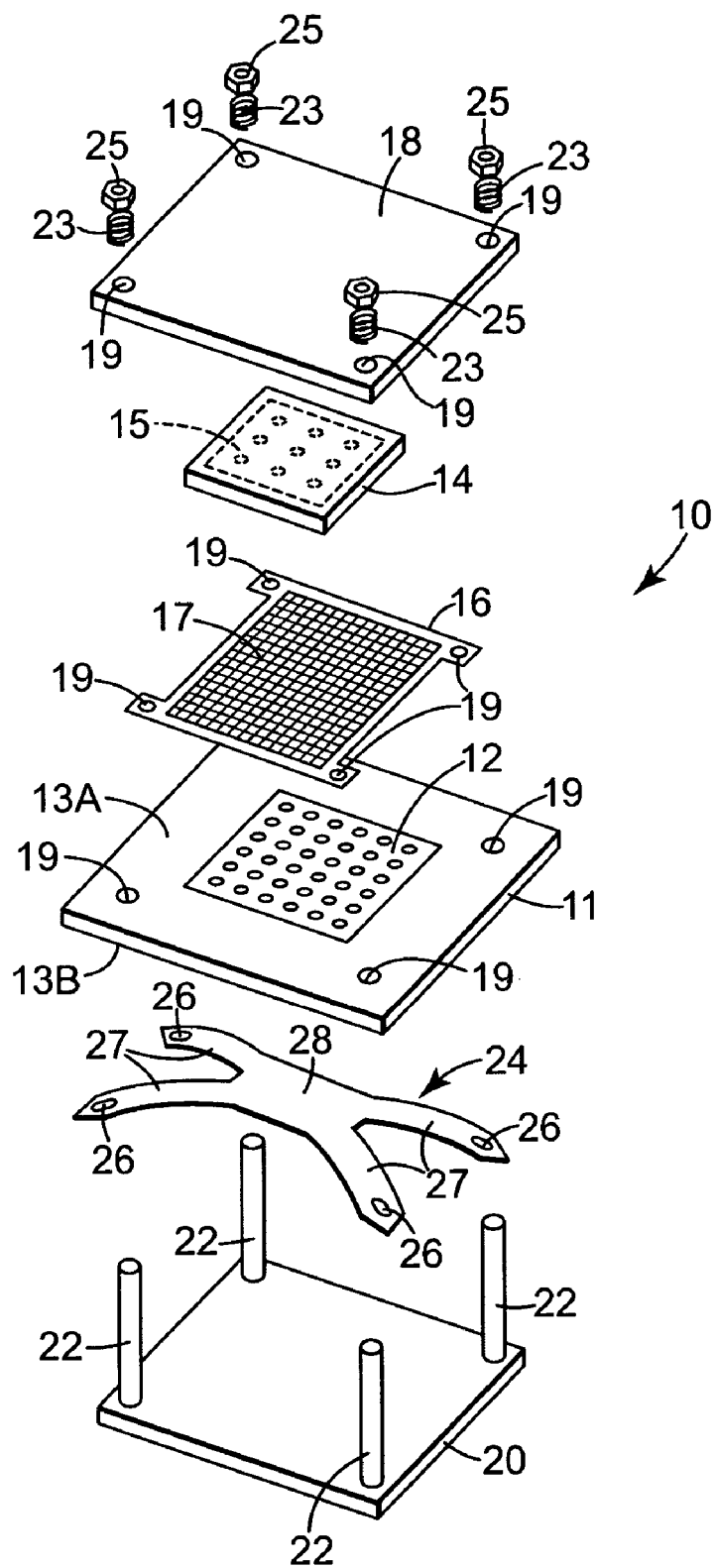
FIG. 3 is an exploded view of FIG. 1, according to an embodiment of the present invention.

As shown in FIGS. 2-3, electronic component system 10 according to one embodiment of the present invention comprises printed circuit board 11, land grid array module 14, interposer 16, heat sink 18, backing plate 20 (or stiffening plate 20), posts 22, and spring member 24.

Printed circuit board 11 includes first side 13A and second side 13B, and carries a variety of electronic components, such as a plurality of land grid array modules, just one of which is shown in FIG. 2. Printed circuit board 11 includes contact array 12 (FIG. 3) of conductive contact elements arranged as a land grid array and onto which interposer 16 is mounted.

Interposer 16 is disposed on first side 13A of printed circuit board 11 and a land grid array socket connector for establishing mechanical and electrical contact between printed circuit board 11 and land grid array module 14. Interposer 16 employs any one or more of known conductive elements including fuzz buttons, metal springs, dendritic contacts, and/or conductive elastomers, such as Metallized Particle Interconnects (MPI). As shown in FIG. 3, interposer 16 includes contact array 17 (FIG. 3) of conductive contact elements arranged in a land grid array pattern for electrical communication with contact array 12 of printed circuit board 11 and with contact array 15 of land grid array module 14.

Land grid array module 14 is any electronic integrated circuit package for use in a circuit carried on printed circuit board 11 and that is configured for use with socket connectors such as interposer 16. For example, land grid array module 14 can be a very large scale integration (VSLI) integrated circuit, like a central processing unit (CPU) or application specific integrated circuit (ASIC), as well as other types of integrated circuits. Land grid array module 14 is mounted in interposer 16 on first side 13A of printed circuit board 12. On its bottom surface, land grid array module 14 includes contact array 15 of conductive contact elements for electrical connection to contact array 17 of interposer 16.

Posts 22 permit connecting printed circuit board 11, land grid array module 14, interposer 16, backing plate 20, and heat sink 18 together. Posts 22 also optionally receive helical springs 23 for applying a compressive force to these components to achieve electrical communication between land grid array module 14, interposer 16 and printed circuit board 11. Fasteners 25 are used with posts 22 and springs 23 for applying the compressive force. Other arrangements of springs, fasteners, plates, and clamping mechanisms are optionally employed for securing the components of system 10 into an assembly.

Backing plate 20 acts as a stiffener to support printed circuit board 11 under compressive loading to counteract deflection of printed circuit board 11, which otherwise results in compromising stable electrical connection between land grid array module 14, interposer 16, and printed circuit board 11. Backing plate 20 is secured relative to printed circuit board 11 via posts 22 to maintain a fixed spacing between backing plate 20 and printed circuit board 11.

As shown in FIG. 2, first portion 27 of spring member 24 is secured to backing plate 20 and second portion 28 of spring member 24 is in pressing contact against second side 13B of printed circuit board 11. In this arrangement, a convexity formed by the curved shape defined by first portion 27 and second portion 28 of spring member 24 faces second side 13B of printed circuit board 11. Spring member 24 presses against a central area of printed circuit board 11 positioned underneath land grid array module 14 to substantially uniformly distribute a compressive force across the contact arrays of land grid array module 14, interposer 16, and printed circuit board 11, as will be further described in association with FIGS. 3-5.

As shown in FIG. 3, posts 22 extend upward from the corners of backing plate 20. Each of heat sink 18, interposer 16, and printed circuit board 11 includes holes 19 at their corners for receiving posts 22 for securing heat sink 18, interposer 16, printed circuit board 11, respectively, relative to land grid array module 14 and backing plate 20 to achieve an assembled state as shown in FIG. 2. Spring member 24 includes holes 26 for securing spring member between backing plate 20 and printed circuit board 11.

Figure 4:
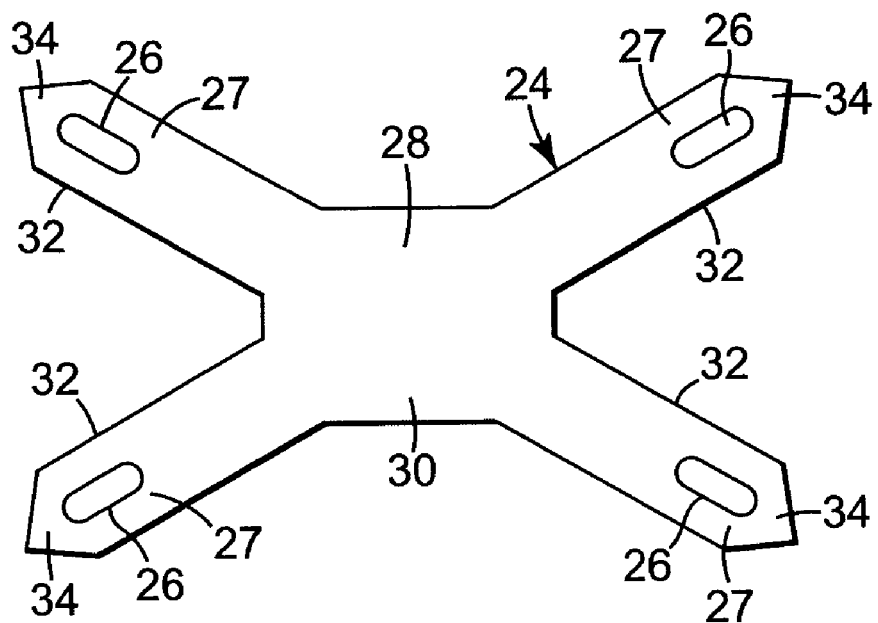
FIG. 4 is top plan view of a spring member force distributor, according to an embodiment of the present invention.

As shown in FIG. 4, spring member 24 includes second portion 28, which forms central body portion 30, and first portion 27, which forms legs 32 that extend radially outward from central body portion 30. Legs 32 include ends 34 and holes 26. Holes 26 include an elongate shape and are configured and sized for receiving posts 22. Holes 26 are elongated in direction generally parallel to leg 32 so that each leg 32 of spring member 24 is capable of sliding laterally outward and inward over a limited distance relative to posts 22 to prevent binding of legs 32 on posts 22.

Spring member 24 has a curved shape and comprises a metallic material, such as stainless steel, that is resilient and that exhibits springiness when deflected from its original shape. Spring member 24 has a stiffness (based on its thickness, type of material, and curvature) that is selected to produce a biasing force sufficient to maintain a contact force that is within a minimum range (e.g., 30 to 70 grams force per conductive element) and that is substantially the same as the minimum contact forces at the edges and corners of land grid array module 14, interposer 16, and printed circuit board 11. As previously described, this biasing force exerted by spring member 24 is translated through printed circuit board 11 to interposer 16 and land grid array module 14 to insure a substantially uniform contact force across contact arrays 12, 15, and 17 of printed circuit board 11, land grid array module 14, and interposer 16, respectively.

Spring member 24 is used along with conventional helical springs 23 and/or other members which conventionally apply a compressive force to land grid array module 14, interposer 16, and printed circuit board 11. However, spring member 24 also can be optionally used to provide substantially all of the compressive force between land grid array module 14, interposer 16, and printed circuit board 11. In this arrangement, other mechanisms for applying compressive forces, such as separate helical coil springs 23 (which are customarily mounted about posts 22), are not used. However, in this alternate arrangement, the stiffness of spring member 24 is increased to insure a sufficient compressive load is applied to the assembled system 10 including land grid array module 14, interposer 16, and printed circuit board 11.

Spring member 24 is optionally coated with an insulating material so that spring member 24 can additionally function as an insulator between backing plate 20 and printed circuit board 11.

Figure 5:
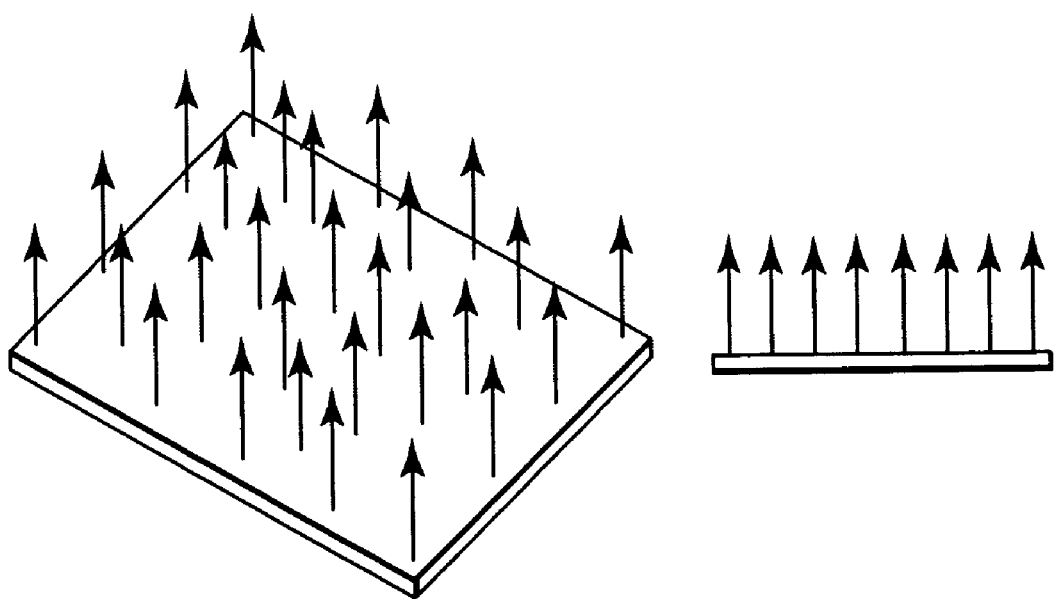
FIG. 5 is an illustration of a force pattern resulting from use of a spring member, according to an embodiment of the present invention.

FIG. 5 illustrates a force pattern resulting from use of spring member 24 according to one embodiment of the present invention in system 10. As shown in FIG. 5, the contact forces between respective contacts arrays 15, 17 of land grid array module 14 and interposer 16, or between respective contact arrays 17, 12 of interposer 16 and printed circuit board 11, is distributed in a substantially uniform pattern across those contact arrays from their edges and corners through their center. This balanced force pattern shown in FIG. 5 is achieved because the biasing force of spring member 24 exerted against printed circuit board 11 prevents its deflection, as well as deflection of interposer 16 and/or land grid array module 14 under a clamping compression force (produced by load posts 22 and springs 23, or other clamping mechanisms) experienced by land grid array module 14, interposer 16, and printed circuit board 11 relative to each other.

Figure 6:
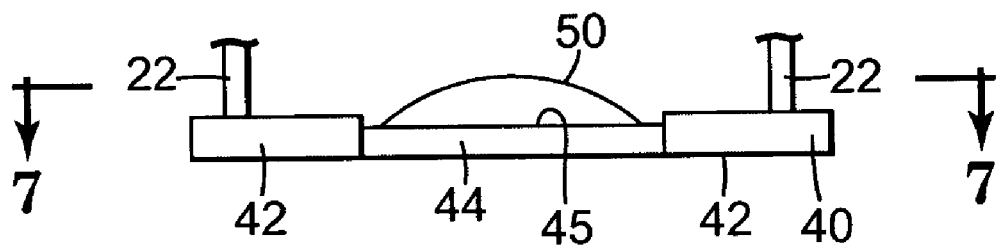
FIG. 6 is a partial side view of an alternate spring member, according to an embodiment of the present invention.
Figure 7:
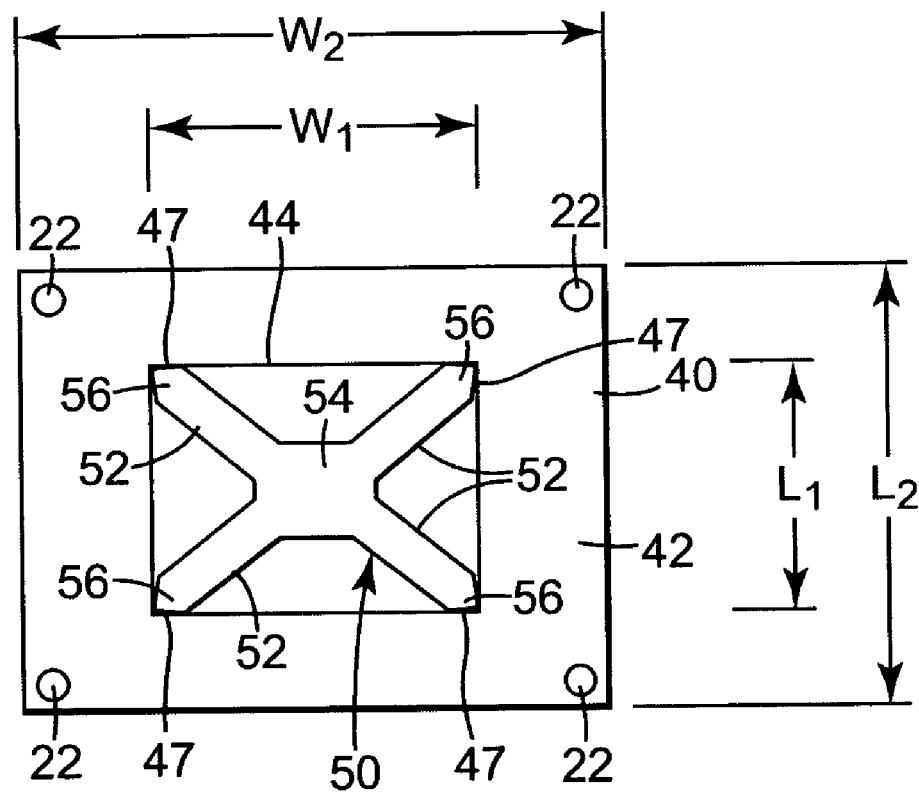
FIG. 7 is a top view of FIG. 6.

FIG. 6 illustrates an alternate system 60 according to one embodiment of the present invention including spring member 50, and modified backing plate 40. Backing plate 40 comprises main body 42 and recess portion 44 that is sized and shaped for receiving spring member 50. Recess portion 44 has a length ($L_1$) and a width ($W_1$) that are less than a length ($L_2$) and width ($W_2$) of main body 42. Recess portion 44 has a depth relative to main body 42 that is sufficient to maintain the position of legs 54 of spring member 50.

Spring member 50 includes central body portion 52 (i.e. second portion) and legs 54 (i.e. first portion) extending radially outwardly from central body portion 52. However, legs 54 do not includes holes for receiving posts 22. Instead ends 56 of legs of spring member 50 are sized and shaped for being lodged into corners 47 of recess portion 44 and held in that position through the springiness of spring member 50. In all other respects, spring member 50 carries substantially the same features and attributes as spring member 24, as previously described in association with FIGS. 2-4.

Spring member 50 conveniently allows the selective addition of a force distributing biasing force independent of posts 22 and springs 23 thereby permitting greater flexibility in the use and installation of spring member 50 of the present invention. In addition, the arrangement of spring member 50 in combination with recess portion 44 of modified backing plate 40 facilitates maintaining a low profile or low elevation on second side 13B of printed circuit board 11.

In one embodiment, of the present invention the spring member applies a centrally located compressive force without the need for a conventional centrally-located compressive screw. In one embodiment, the spring member acts as a force distributor to insure a substantially uniform contact force between the contact arrays of a land grid array and an interposer, and between the contact arrays of the interposer and a printed circuit board. Since the spring member can apply a force without a central load screw, the spring member can supply its force selectively to counteract bowing, deflections, and flatness intolerances, etc. that arise when the electronic components (e.g., printed circuit board, interposer, land grid array) are under compression. If desired, the spring member can optionally supply the compressive force to the electronic components.

While specific embodiments have been illustrated and described, herein for purposes of description of the preferred embodiment, it will be appreciated by those of ordinary skill in the art that a wide variety of alternate and/or equivalent implementations may be substituted for the specific embodiments shown and described without departing from the scope of the present invention. Those with skill in the chemical, mechanical, electromechanical, electrical, and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. An electronic component system comprising:
    a land grid array module;
    a printed circuit board having a first side and a second side;
    an interposer disposed between the module and the first side of the printed circuit board;
    a backing plate spaced from, and disposed on the second side of the printed circuit board opposite the first side;
    a plurality of posts extending through and connecting each of module, the printed circuit board, the interposer, and the backing plate relative to each other; and
    a curved spring member disposed between the backing plate and the second side of the printed circuit board, and having a first portion in secured contact with the backing plate and a second portion in unsecured, pressing contact against the second side of the printed circuit board adjacent a center of the printed circuit board,
    wherein the second portion of the spring member comprises a curved central body portion and wherein the backing plate includes a recessed portion defined in a main body of the backing plate that is configured to receive the first portion of the spring member.

2. The system of claim 1 wherein the recessed portion of the backing plate has a width less than a width of the main body of the backing plate and has a length less than a length of the main body of the backing plate, and the curved spring member is sized and shaped to be removably secured within the recessed portion of the backing plate.

3. A method of distributing a contact force between a land grid array module and a printed circuit board, the method comprising:
    securing the land grid array module to a first side of the printed circuit board via an interposer disposed on the first side of the printed circuit board and via a backing plate disposed on, and spaced from, a second side of the printed circuit board; and
    biasing a curved spring member between the backing plate and the second side of the printed circuit board to insure a substantially uniform contact force across the module, the interposer, and the printed circuit board wherein a first portion of spring member is removably secured within a recess of the backing plate and a second portion of the spring member is biased in unsecured, pressing direct contact against the second side of the printed circuit board.

4. The method of claim 3 wherein securing the land grid array comprises:
    extending at least one load post through each one of four corners of the land grid array module, the interposer, the printed circuit board, and the backing plate; and
    introducing, with a load spring mounted on each one of the load posts, a compressive force between the land grid array module, the interposer, and the printed circuit board.

5. The method of claim 3 wherein biasing the spring member comprises:
    using the spring member to provide substantially all of a compressive force exerted on the land grid array module, the interposer, and the printed circuit board.

* * * * *